United States Patent
Lu et al.

(10) Patent No.: US 8,837,169 B2
(45) Date of Patent: Sep. 16, 2014

(54) EMI SHIELDING DEVICE WHICH CAN BE EASILY ASSEMBLED AND DISASSEMBLED

(75) Inventors: Fu-Lung Lu, New Taipei (TW); Yi-He Huang, New Taipei (TW)

(73) Assignee: Wistron Corporation, New Taipei (TW)

( * ) Notice: Subject to any disclaimer, the term of this patent is extended or adjusted under 35 U.S.C. 154(b) by 110 days.

(21) Appl. No.: 13/616,959

(22) Filed: Sep. 14, 2012

(65) Prior Publication Data

US 2013/0294044 A1 Nov. 7, 2013

(30) Foreign Application Priority Data

May 3, 2012 (TW) .............................. 101115771 A

(51) Int. Cl.
*H05K 9/00* (2006.01)
*H01F 27/32* (2006.01)
*H05K 3/30* (2006.01)

(52) U.S. Cl.
USPC ........ 361/818; 361/816; 361/799; 174/138 E; 174/138 G

(58) Field of Classification Search
CPC ....................................... H05K 9/00
USPC ............ 361/799, 816, 818; 174/138 E, 138 G
See application file for complete search history.

(56) References Cited

U.S. PATENT DOCUMENTS

| | | | | |
|---|---|---|---|---|
| 832,284 | A | * | 10/1906 | White .............................. 292/83 |
| 1,975,173 | A | * | 10/1934 | Pennock et al. ............... 206/232 |
| 4,821,146 | A | * | 4/1989 | Behrens et al. ............... 361/692 |
| 5,552,967 | A | * | 9/1996 | Seto et al. ...................... 361/818 |
| 5,920,539 | A | * | 7/1999 | Schell et al. ................... 720/658 |
| 5,967,837 | A | * | 10/1999 | Wolfe et al. .................... 439/550 |
| 6,068,323 | A | * | 5/2000 | Brown et al. .................. 296/97.9 |
| 6,102,608 | A | * | 8/2000 | Hogan et al. .................. 403/300 |
| 6,288,333 | B1 | * | 9/2001 | Liu et al. ........................ 174/563 |
| 6,362,978 | B1 | * | 3/2002 | Boe ................................ 361/825 |
| 6,374,460 | B1 | * | 4/2002 | Edevold et al. ................. 16/422 |
| 6,424,538 | B1 | * | 7/2002 | Paquin .......................... 361/752 |
| 6,443,315 | B1 | * | 9/2002 | Tabuchi ..................... 211/41.17 |
| 6,464,102 | B1 | * | 10/2002 | Harmon et al. ............... 220/835 |
| 6,738,261 | B2 | * | 5/2004 | Vier et al. ...................... 361/740 |

(Continued)

FOREIGN PATENT DOCUMENTS

| TW | 232795 | 10/1994 |
|---|---|---|
| TW | 201030498 A | 8/2010 |
| TW | 201208628 A | 3/2012 |

OTHER PUBLICATIONS

Office Action issued Jun. 6, 2014 of Taiwanese Patent Appln. No. 101115771 [English translation of passages are boxed].

*Primary Examiner* — Lisa Lea Edmonds
*Assistant Examiner* — Rashen E Morrison
(74) *Attorney, Agent, or Firm* — Whyte Hirschboeck Dudek S.C.

(57) ABSTRACT

An electromagnetic interference (EMI) shielding device includes first and second housing portions assembled along an assembly direction, at least two spaced-apart female fasteners fixed to one of the first and second housing portions, a plurality of male fasteners corresponding in number to the female fasteners and spacedly fixed to the other one of the first and second housing portions, and at least one grip member connected to one of the first and second housing portions. The grip member is applied with a force along the assembly direction or along a direction opposite to the assembly direction to engage or disengage the male and female fasteners.

12 Claims, 8 Drawing Sheets

(56) References Cited

U.S. PATENT DOCUMENTS

| | | | |
|---|---|---|---|
| 6,799,980 B2 * | 10/2004 | Bloomfield et al. | 439/92 |
| 6,955,550 B2 * | 10/2005 | Schlack | 439/160 |
| 7,028,389 B2 * | 4/2006 | Chang | 29/739 |
| 7,212,400 B2 * | 5/2007 | Fan et al. | 361/679.58 |
| 7,258,574 B2 * | 8/2007 | Barringer et al. | 439/607.01 |
| 7,301,778 B1 * | 11/2007 | Fang | 361/759 |
| 7,364,442 B2 * | 4/2008 | Bang et al. | 439/92 |
| 7,586,748 B2 * | 9/2009 | Chen | 361/727 |
| 7,715,202 B2 * | 5/2010 | Morita | 361/759 |
| 7,738,255 B2 * | 6/2010 | Nishimoto et al. | 361/729 |
| 8,031,483 B2 * | 10/2011 | Hsiao et al. | 361/807 |
| 8,369,094 B2 * | 2/2013 | McLean et al. | 361/747 |
| 8,570,757 B2 * | 10/2013 | Snider et al. | 361/752 |
| 8,654,523 B2 * | 2/2014 | Adkins et al. | 361/679.47 |
| 2003/0035271 A1 * | 2/2003 | Lelong et al. | 361/724 |
| 2004/0120108 A1 * | 6/2004 | Wang | 361/683 |
| 2010/0208422 A1 | 8/2010 | Tai et al. | |
| 2010/0265669 A1 * | 10/2010 | Schnuerer et al. | 361/747 |
| 2013/0294044 A1 * | 11/2013 | Lu et al. | 361/818 |

* cited by examiner

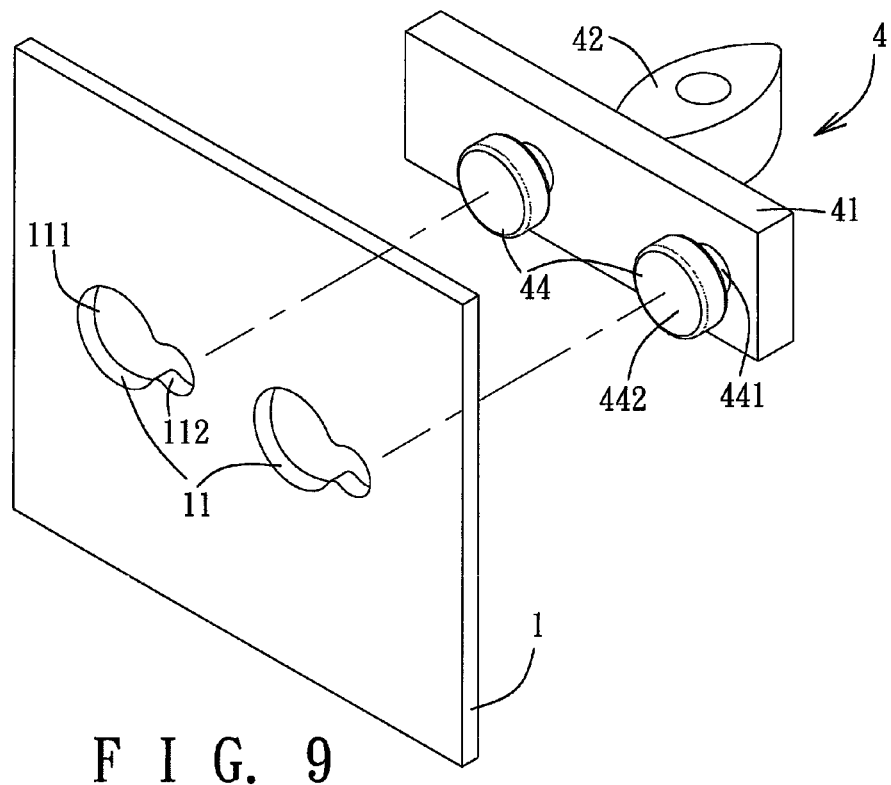
F I G. 9
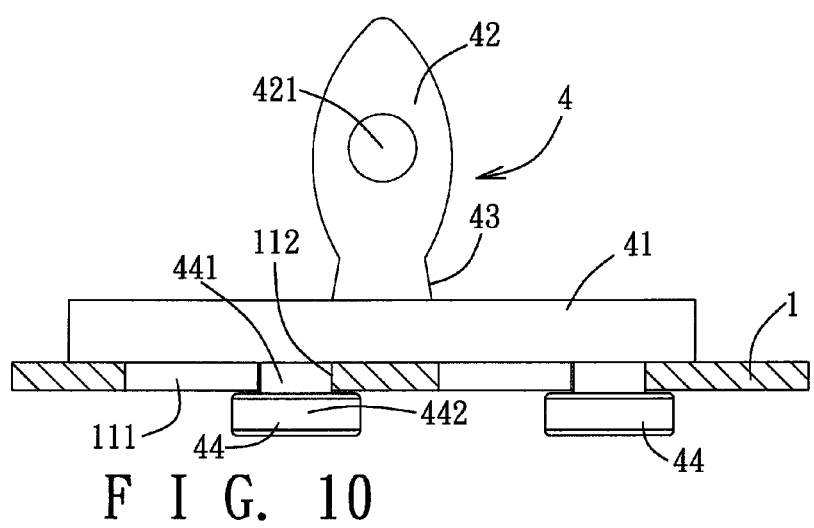
F I G. 10

EMI SHIELDING DEVICE WHICH CAN BE EASILY ASSEMBLED AND DISASSEMBLED

CROSS-REFERENCE TO RELATED APPLICATION

This application claims priority of Taiwanese Patent Application No. 101115771, filed on May 3, 2012, the disclosure of which is incorporated herein by reference.

BACKGROUND OF THE DISCLOSURE

1. Field of the Disclosure

The disclosure relates to an electromagnetic interference (EMI) shielding device, and more particularly to an EMI shielding device which can be easily assembled and disassembled.

2. Description of the Related Art

A conventional EMI shielding device for an electronic device mainly includes a metal or metal-plated housing for covering electronic components in the electronic device so as to provide an EMI shielding effect for the electronic components. Generally, the housing is connected to the electronic device by using screws.

Although such a screw fastening method can stably connect the housing to the electronic device, when it is required to remove the housing in order to repair the electronic components, a tool must be used to remove the screws. This step is very time-consuming, resulting in low efficiency in removal of the housing.

In US Publication No. 2011/0186343, a screw-free EMI shielding device having a cover capable of lateral sliding is disclosed. When it is required to repair an internal electronic component, it only needs to slide the cover laterally to reduce the time for disassembly and assembly. However, an electronic device using the aforesaid EMI shielding device must provide a sufficient space for lateral displacement of the cover.

Therefore, use of the existing EMI shielding devices is very inconvenient and limited, so that an improvement is necessary.

SUMMARY OF THE DISCLOSURE

Therefore, an object of the present disclosure is to provide an EMI shielding device which can be easily assembled and disassembled so as to reduce the operating time and space.

According to this disclosure, an electromagnetic interference (EMI) shielding device for receiving an electronic component comprises a first housing portion, a second housing portion removably fixed to the first housing portion along an assembly direction, at least two spaced-apart female fasteners fixed to one of the first and second housing portions, a plurality of male fasteners corresponding in number to the female fasteners and spacedly fixed to the other one of the first and second housing portions, and at least one grip member connected to one of the first and second housing portions. The first and second housing portions cooperatively define a receiving space for receiving the electronic component. Each of the female fasteners includes an engaging groove having an opening facing the other one of the first and second housing portions. Each of the male fasteners extends engagingly into the engaging groove of a corresponding female fastener through the opening. The grip member is applied with a force along the assembly direction or along a direction opposite to the assembly direction to engage or disengage the male and female fasteners.

The effect of the present disclosure resides in that with each of the female fasteners including the engaging groove having the opening in the assembly direction, and with the provision of the grip members, each of the female fasteners can be quickly engaged to or disengaged from the corresponding male fastener in the assembly direction or in a direction opposite to the assembly direction. As such, no additional tool or component and no additional step are required to disengage the female fasteners from the male fasteners. Moreover, when the second housing portion is disassembled from the first housing portion, no extra space is required for disengaging the female fasteners from the corresponding male fasteners.

BRIEF DESCRIPTION OF THE DRAWINGS

Other features and advantages of the present disclosure will become apparent in the following detailed description of the embodiment with reference to the accompanying drawings, of which:

FIG. 9 is an enlarged exploded perspective view of a second alternative form of connection between the male fastener and the first housing portion without using screws;

FIG. 10 is an enlarged assembled sectional view of the second alternative form of connection between the male fastener and the first housing portion;

DETAILED DESCRIPTION OF THE PREFERRED EMBODIMENTS

The above-mentioned and other technical contents, features, and effects of this disclosure will be clearly presented from the following detailed description of one embodiment in coordination with the reference drawings.

Figure 1:
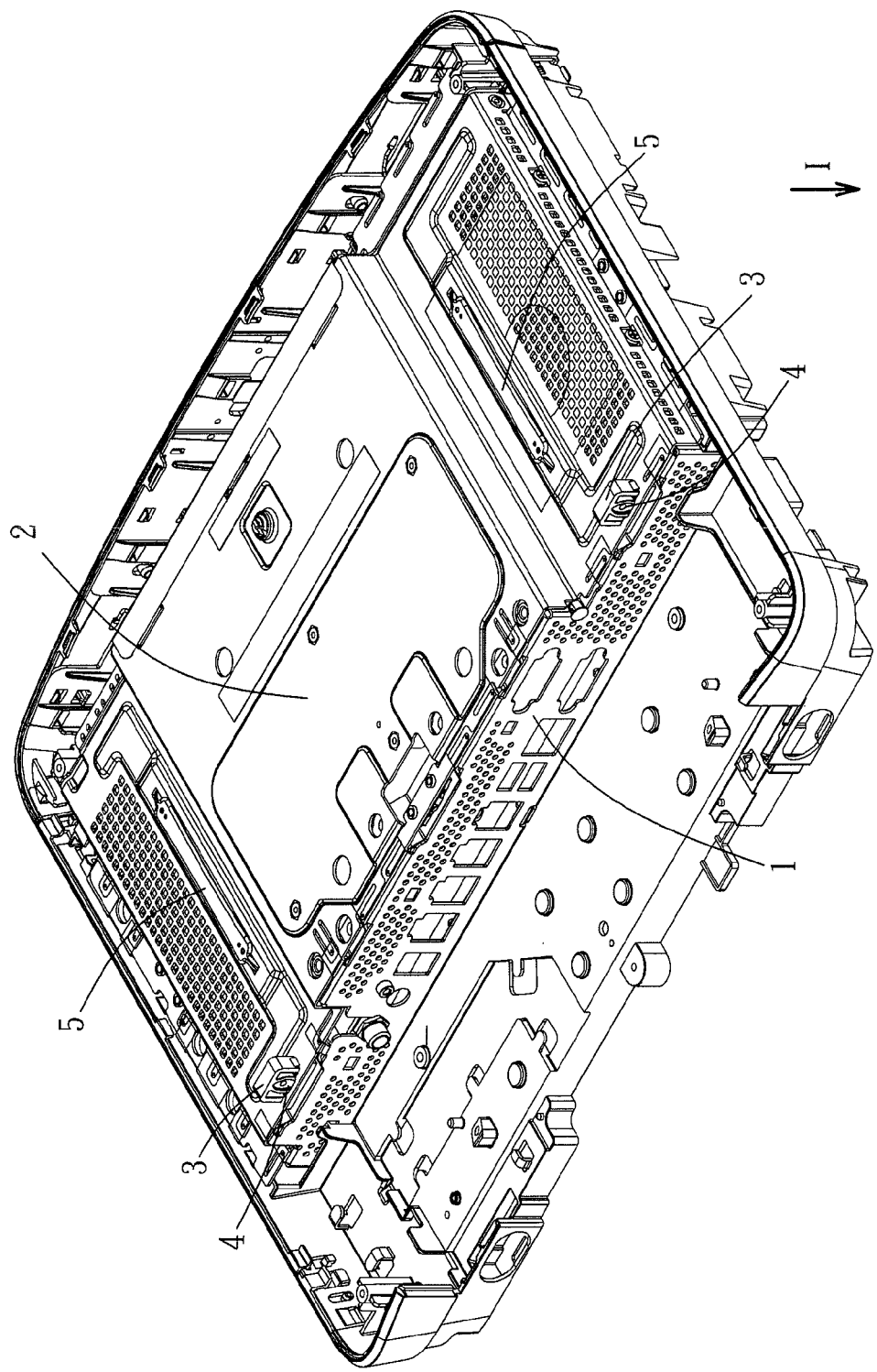
FIG. 1 is an assembled perspective view of an EMI shielding device according to an embodiment of the present disclosure.
Figure 2:
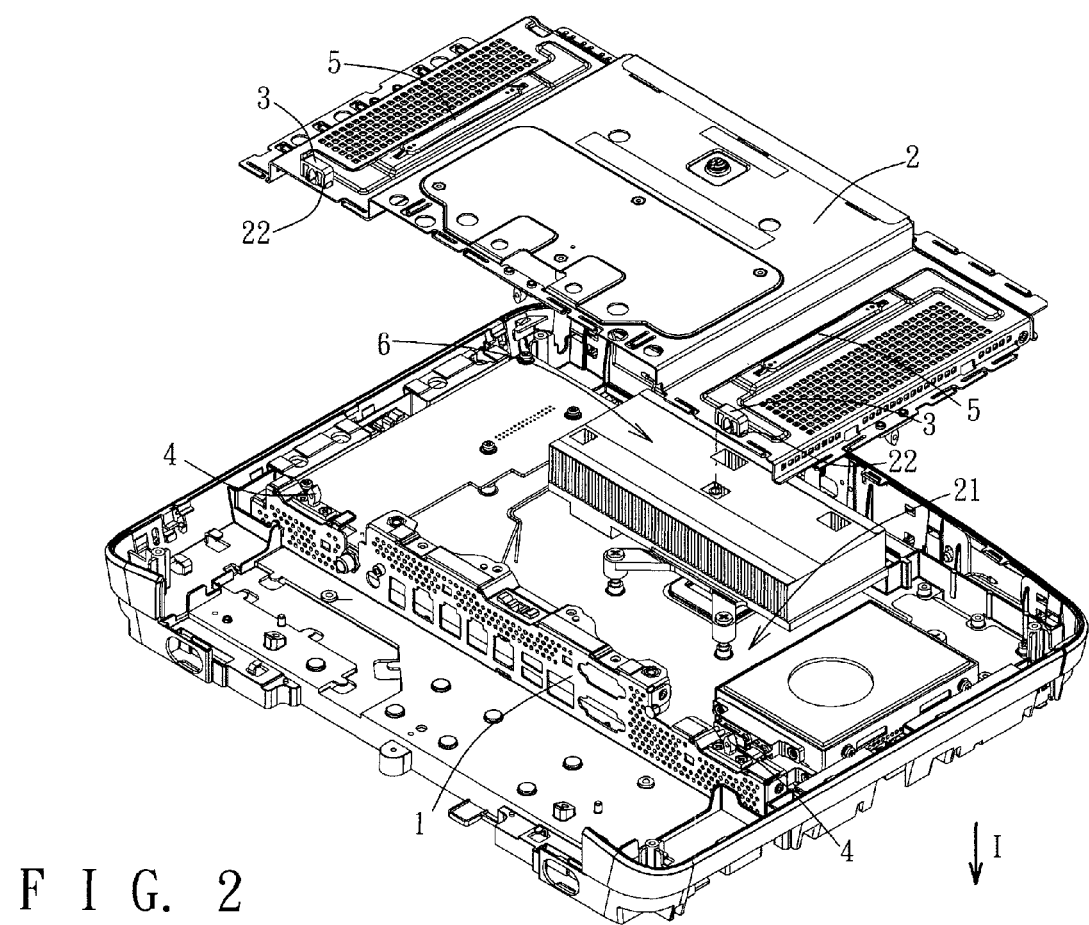
FIG. 2 is a view similar to FIG. 1, but with a second housing portion removed for the sake of clarity.

Referring to FIGS. 1 and 2, an EMI shielding device according to an embodiment of the present disclosure is adapted for receiving an electronic component 6 of an electronic device, and comprises a first housing portion 1, a second housing portion 2 removably fixed to the first housing portion 1 in an assembly direction (I), two female fasteners 3 fixed to the second housing portion 2 and spaced apart from each other along a direction transverse to the assembly direction (I), two male fasteners 4 fixed to the first housing portion 1 and respectively corresponding in position to the female fasteners 3, and two spaced-apart grip members 5 connected to the second housing portion 2. The first and second housing portions 1, 2 are fixed to each other through the male and female fasteners 4, 3, and cooperatively define a receiving space 21 for receiving the electronic component 6. The female and male fasteners 3, 4 are made of metal to increase a conductive area of the first and second housing portions 1, 2, so that the EMI shielding device can achieve a better EMI shielding effect. Each of the grip members 5 permits gripping by a user. The user can pull the grip members 5 to move along a direction opposite to the assembly direction (I) so as to separate the second housing portion 2 from the first housing portion 1.

It is understandable that the female fasteners 3 may be fixed to one of the first and second housing portions 1, 2, and the male fasteners 4 may be fixed to the other one of the first and second housing portions 1, 2 corresponding to the female fasteners 3. As long as the female and male fasteners 3, 4 can fix the first and second housing portions 1, 2 to each other, any variation in the disposition of the female and male fasteners 3, 4 is acceptable. Further, the number of each of the male and female fasteners 4, 3 is not limited to two. It is preferable that the number of each of the male and female fasteners 4, 3 is more than two and is uniformly distributed. Similarly, the grip members 5 may be fixed to any one of the first and second housing portions 1, 2, as long as the grip members 5 can be gripped and pulled to separate the first and second housing portions 1, 2 from each other. Moreover, the number of the grip member 5 may be one that is disposed in the center of the second housing portion 2 according to the requirement. Therefore, the fixing positions and patterns of the female and male fasteners 3, 4 and the grip members 5 are not limited to the disclosed embodiment.

Figure 3:
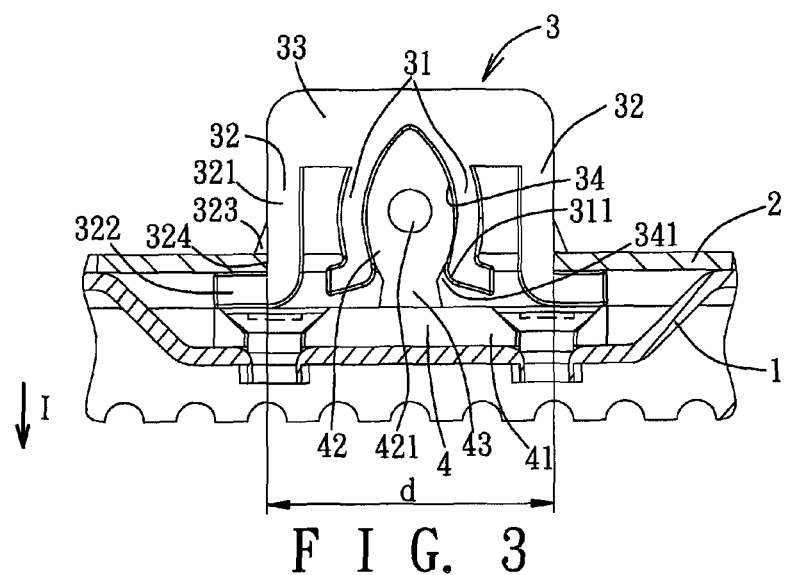
FIG. 3 is an enlarged fragmentary sectional view of the embodiment, illustrating how male and female fasteners are interconnected.
Figure 4:
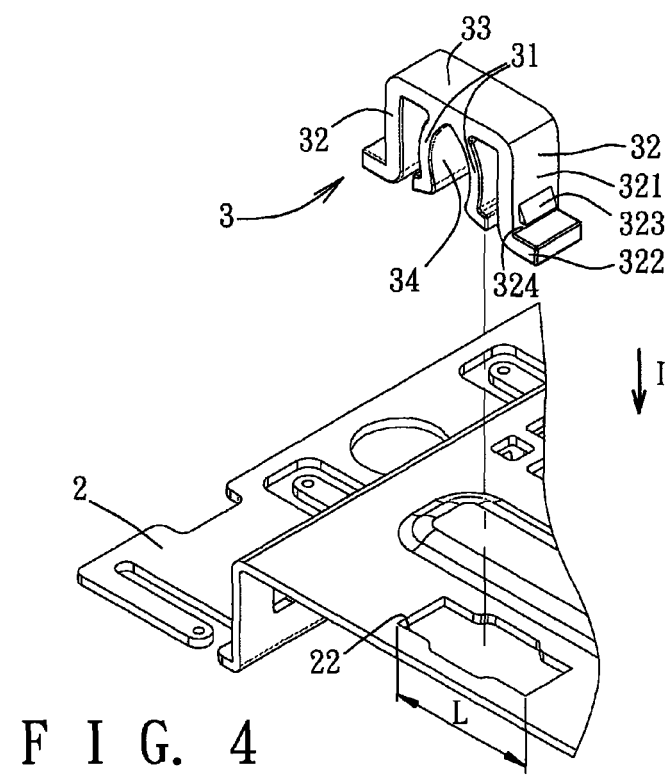
FIG. 4 is an enlarged fragmentary exploded perspective view of the embodiment, illustrating the structure of the female fastener.

Referring to FIG. 3 and FIG. 4, each of the female fasteners 3 includes two resilient arms 31 extending towards a corresponding one of the male fasteners 4, two fixed arms 32 respectively located on outer sides of the resilient arms 31, a connecting portion 33 connecting the fixed arms 32 and the resilient arms 31, and an engaging groove 34 cooperatively defined by the resilient arms 31 and having an opening 341 facing the first housing portion 1. Each of the male fasteners 4 includes a base portion 41 fixed to the first housing portion 1, an engaging projection 42 projecting towards the opening 341, and a neck portion 43 connected between the base portion 41 and the engaging projection 42. The engaging projection 42 of each male fastener 4 has a teardrop shape, and is removably engageable with the engaging groove 34 in a respective female fastener 3. The resilient arms 31 cooperatively clamp therebetween the engaging projection 42 of the corresponding male fastener 4 when the corresponding male fastener 4 extends into the engaging groove 34. The engaging groove 34 of each female fastener 3 has a teardrop shape corresponding to that of the engaging projection 42 so as to fittingly receive the same. The neck portion 43 has a width smaller than a maximum width of the engaging projection 42. The resilient arms 31 respectively have limiting end portions 311 that extend toward each other and that cooperatively pinch therebetween a portion of the engaging projection 42 that is proximate to the neck portion 43.

The second housing portion 2 includes a number of fixing holes 22 corresponding to that of the female fasteners 3. Each of the fixed arms 32 includes a main body 321 connected to the connecting portion 33, a bent portion 322 extending outward from one end of the main body 321 that is distal from the connecting portion 33, a wedge-shaped portion 323 projecting from an outer surface of the main body 321 and spaced apart from the bent portion 322, and a fixed groove 324 cooperatively defined by the main body 321, the bent portion 322 and the wedge-shaped portion 323. A minimum distance (d) (see FIG. 3) between the fixed grooves 324 of the fixed arms 32 is substantially equal to the length (L) (see FIG. 4) of a corresponding fixing hole 22. The fixed grooves 324 of the fixed arms 32 are respectively engaged to two opposite sides of a wall which defines the corresponding fixing hole 22, so that the female fasteners 3 can be stably fix to the second housing portion 2.

Figure 5:
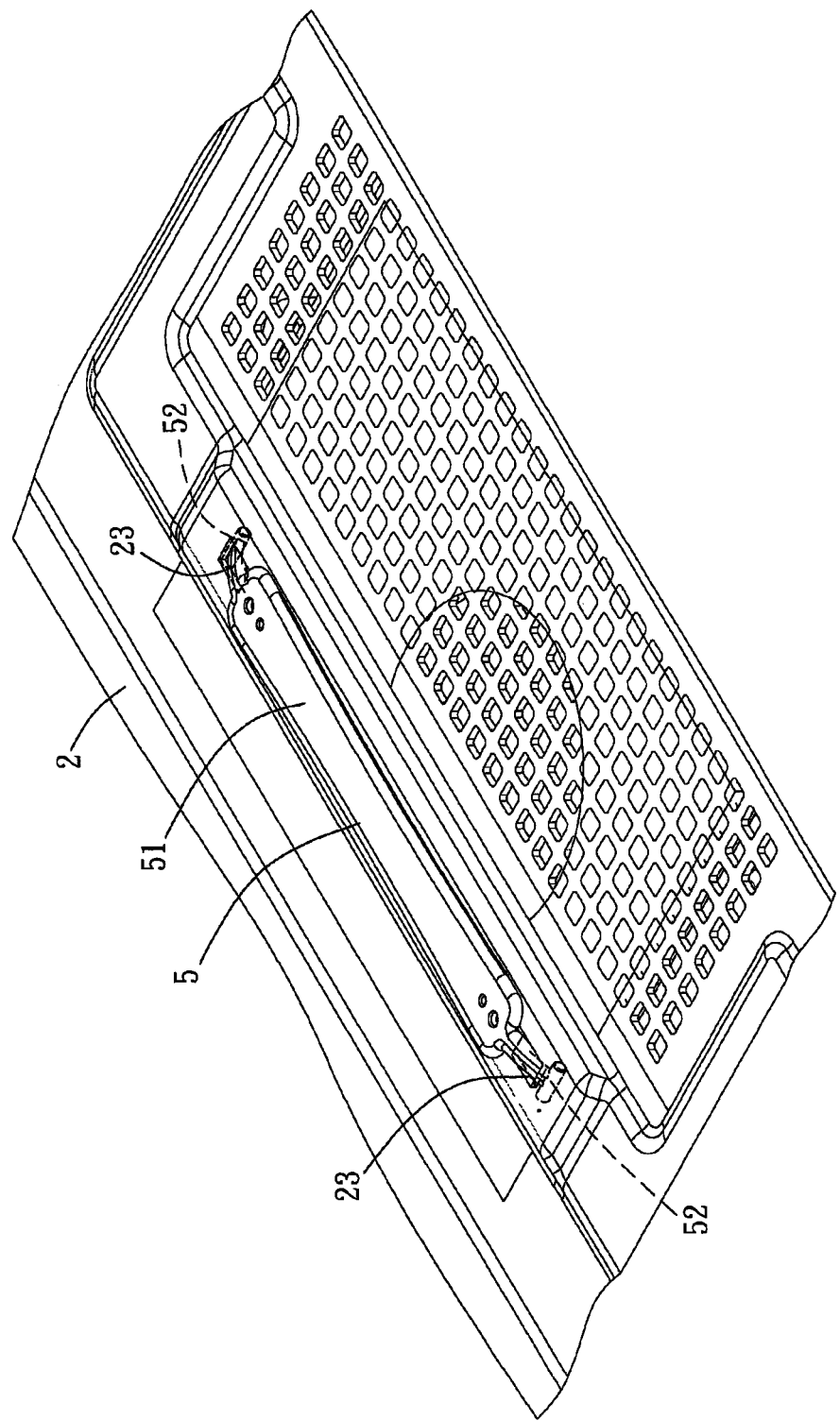
FIG. 5 is an enlarged fragmentary perspective view of the embodiment, illustrating the structure of a grip member.
Figure 6:
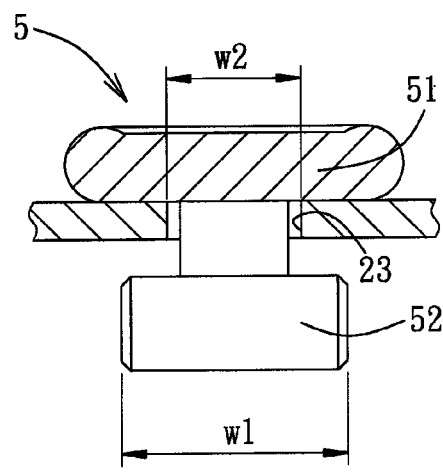
FIG. 6 is an enlarged sectional view of the embodiment, illustrating a connection between the grip member and the second housing portion.

Referring to FIGS. 5 and 6, the second housing portion 2 is formed with two spaced-apart pairs of retaining holes 23. Each of the grip members 5 includes a grip portion 51 for gripping by a hand and having two opposite ends inserted respectively into a corresponding pair of the retaining holes 23, and two retaining portions 52 respectively connected to the two opposite ends of the grip portion 51. Each of the retaining portions 52 has a width (w1) larger than a width (w2) of a corresponding retaining hole 23. The two opposite ends of the grip portion 51 are retained movably in the corresponding pair of the retaining holes 23 through the retaining portions 52. When the grip members 5 are not gripped by the user, the grip portions 51 of the grip members 5 abut against a surface of the second housing portion 2. Therefore, the volume of the EMI shielding device is not increased due to the provision of the grip members 5.

When it is required to disassemble the second housing portion 2 from the first housing portion 1 to repair the electronic component 6 inside the receiving space 21, since the two opposite ends of the grip portion 51 of each grip member 5 are movable in the corresponding pair of the retaining holes 23, the grip portions 51 of the grip members 5 may be separated from the surface of the second housing portion 2 to facilitate gripping by the user. The user grips the grip members 5 with both hands, and applies a force in a direction opposite to the assembly direction (I), thereby separating the second housing portion 2 along with the female fasteners 3 from the first housing portion 1. At this time, two sides of the engaging projection 42 of each male fastener 4 push the resilient arms 31 of the corresponding female fastener 3 so as to deform and move the same away from each other, so that the engaging projection 42 can move out of the engaging groove 34 in the respective female fastener 3 through the opening 341. Hence, the female fasteners 4 can be separated from the respective male fasteners 3. In this process of disassembling the second housing portion 2 from the first housing portion 1, no additional tool and no additional step are required to disengage or engage the female fasteners 4 from the male fasteners 3, so that the time and the complexity of the repair procedure can be greatly reduced. Further, since the openings 341 in the engaging grooves 34 of the female fasteners 3 are in the assembly direction (I) so that the female fasteners 3 can be separated from the respective male fasteners 4 along the direction opposite to the assembly direction (I), no extra space is required to separate the female fasteners 3 from the male fasteners 4. Thus, the space requirement for disassembling the first housing portion 1 and the second housing portion 2 is reduced. Moreover, for the same reason, it is not required to reserve a space inside the electronic device for lateral sliding of a housing or a cover.

Additionally, because the engaging projection 42 of each male fastener 4 is formed with a through hole 421 (see FIG. 3) that extends in a direction perpendicular to the assembly direction (I), when the engaging projection 42 of each male fastener 4 is disengaged from or engaged to the engaging groove 34 of the respective female fastener 3, the maximum width of the engaging projection 42 can be reduced, so that the engaging projection 42 can be easily inserted into or removed from the engaging groove 34.

In this embodiment, each of the male fasteners 4 is fixed to the first housing portion 1 by using two screws. Alternatively, the male fasteners 4 may be fixed to the first housing portion 1 without using screws.

Figure 7:
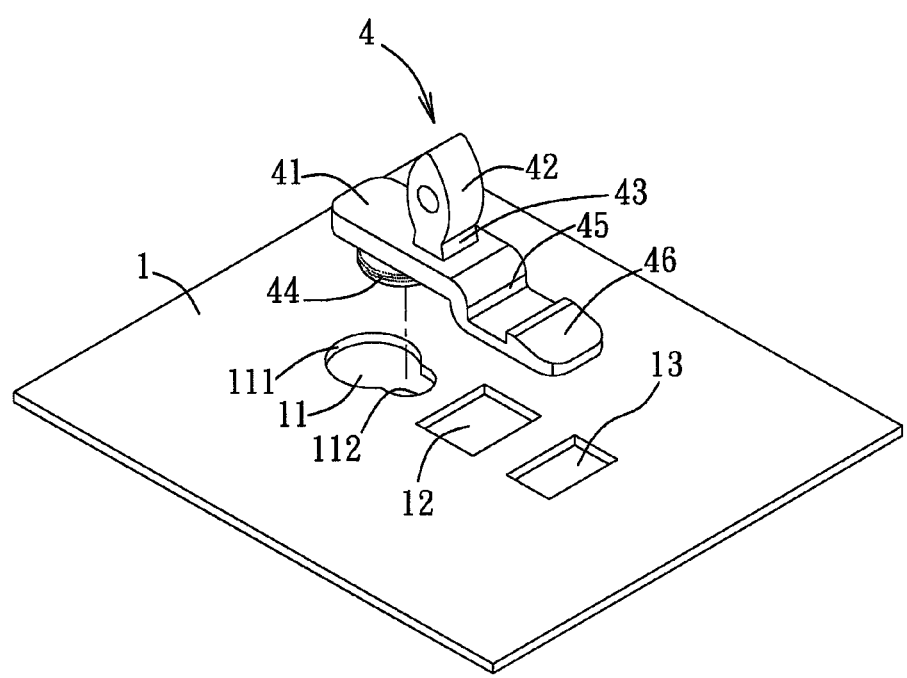
FIG. 7 is an enlarged exploded perspective view of a first alternative form of connection between the male fastener and a first housing portion without using screws.
Figure 8:
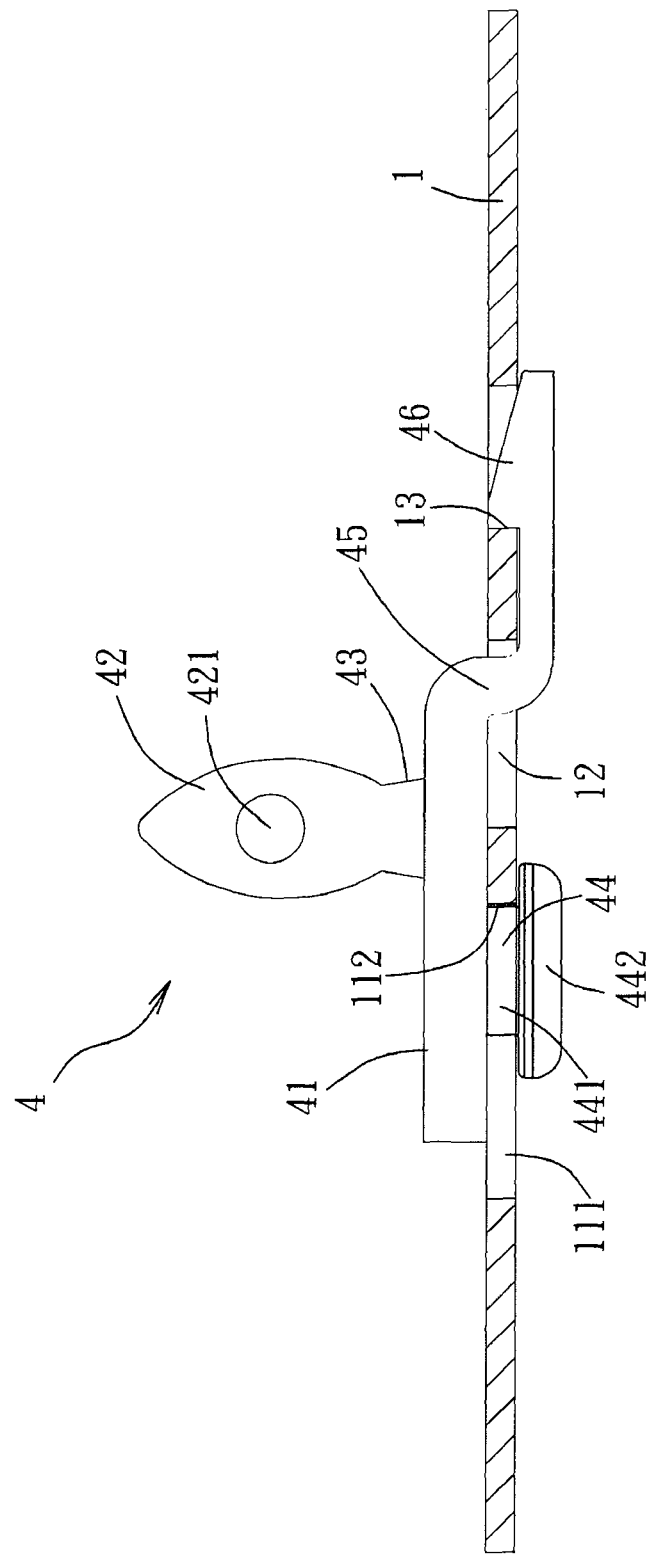
FIG. 8 is an enlarged assembled sectional view of the first alternative form of connection between the male fastener and the first housing portion.

FIGS. 7 and 8 illustrate a first alternative form of connection between the male fasteners 4 (only one is shown) and the first housing portion 1 without using screws. In this case, the first housing portion 1 is formed with an engaging hole 11, an insert hole 12, and a hook hole 13 which are spacedly arranged in a row and which are located at a position corresponding to the male fastener 4. The engaging hole 11 has a large-diameter hole section 111 and a small-diameter hole section 112 in spatial communication with each other. Each male fastener 4 further includes a protrusion 44 protruding from the base portion 41 in a direction opposite to the engaging projection 42, a bent arm 45 extending outwardly from the base portion 41, and an engaging hook 46 located at one end of the bent arm 45. The protrusion 44 has a neck portion 441 and a head portion 442 formed at one end of the neck portion 441. The neck portion 441 is configured to fit into the small-diameter hole section 112 of the engaging hole 11 and thus has a diameter approximately equal to that of the small-diameter hole section 112. The head portion 442 has a diameter larger than that of the neck portion 441 and smaller than that of the large-diameter hole section 111. To interconnect the male fastener 4 and the first housing portion 1, the bent arm 45 is first passed through the insert hole 12 to extend towards the hook hole 13 so as to engage the engaging hook 46 with the hook hole 13. Afterwards, the protrusion 44 is inserted into the large-diameter hole section 111 and is then moved to the small-diameter hole section 112, so that the neck portion 441 of the protrusion 44 is fixedly fitted into the small-diameter hole section 112.

FIGS. 9 and 10 illustrate a second alternative form of connection between the male fasteners 4 (only one is shown) and the first housing portion 1 without using screws. In this case, the first housing portion 1 is formed with two spaced-apart engaging holes 11 at a position corresponding to the male fastener 4. Each of the engaging holes 11 has a large-diameter hole section 111 and a small-diameter hole section 112 in spatial communication with each other. The male fastener 4 further includes two spaced-apart protrusions 44 extending from the base portion 41 in a direction opposite to the engaging projection 42. Each of the protrusions 44 has a neck portion 441 and a head portion 442 formed at one end of the neck portion 441. The neck portion 441 is configured to fit into the small-diameter hole section 112 of a corresponding engaging hole 11 and thus has a diameter slightly smaller than or approximately equal to that of the small-diameter hole section 112. The head portion 442 has a diameter larger than that of the neck portion 441 and smaller than that of the large-diameter hole section 111 of the corresponding engaging hole 11. To interconnect the male fastener 4 and the first housing portion 1, the protrusions 44 are first inserted into the large-diameter hole sections 111 of the respective engaging holes 11, and are then moved to the small-diameter hole sections 112 of the respective engaging holes 11, so that the neck portions 441 of the protrusions 44 are fixedly fitted into the small-diameter hole sections 112 of the respective engaging holes 11.

Figure 11:
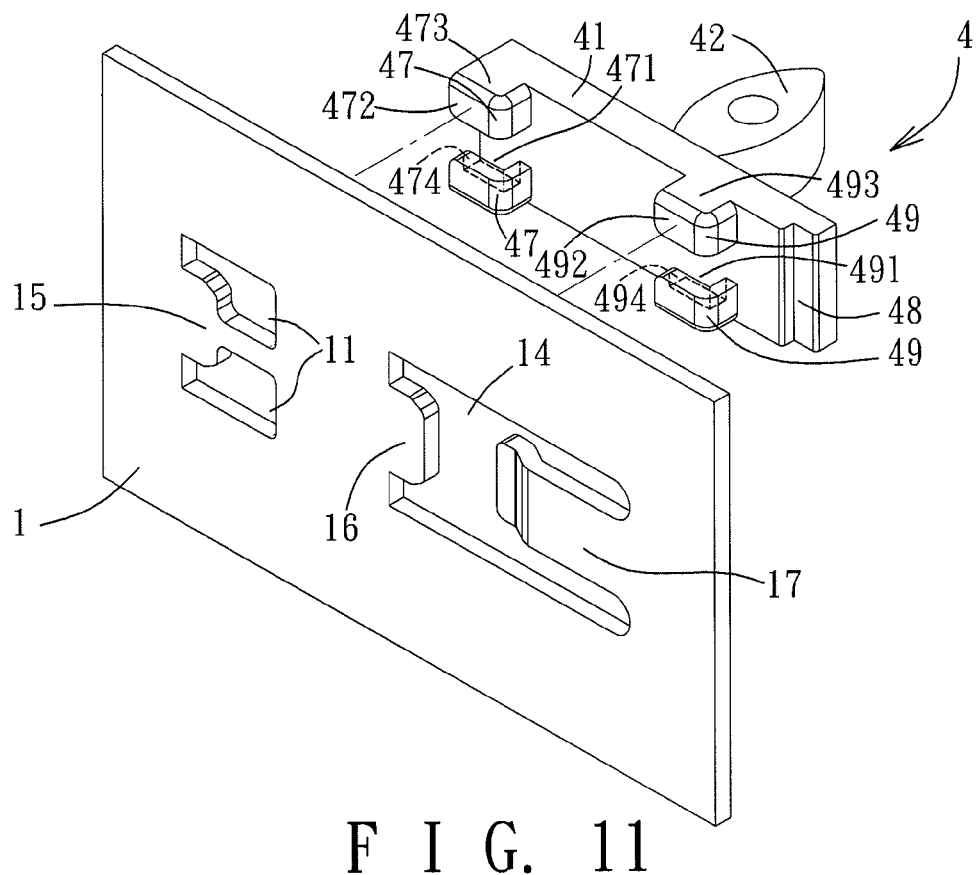
FIG. 11 is an enlarged exploded perspective view of a third alternative form of connection between the male fastener and the first housing portion without using screws.
Figure 12:
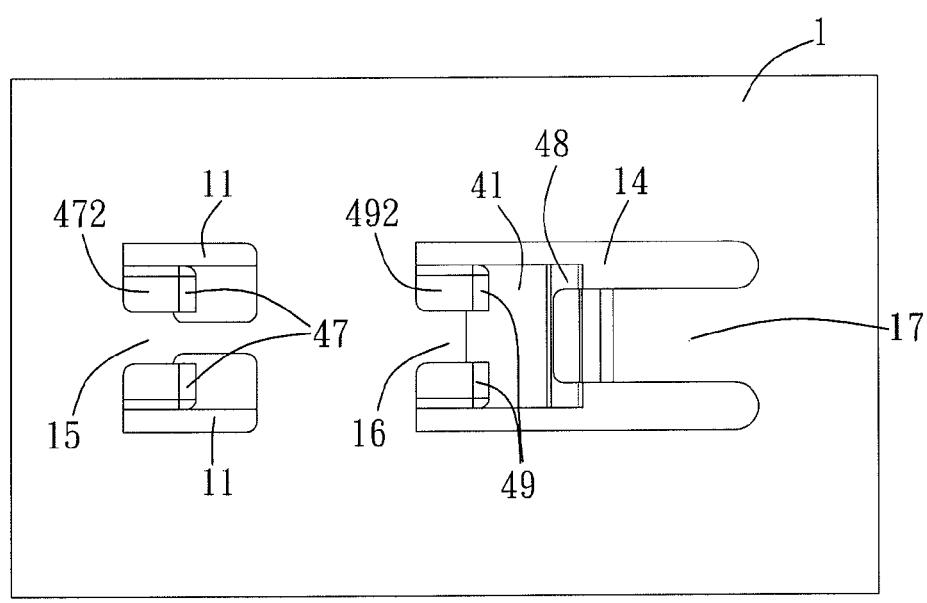
FIG. 12 is an assembled schematic view of FIG. 11.

FIGS. 11 and 12 illustrate a third alternative form of connection between the male fasteners 4 (only one is shown) and the first housing portion 1 without using screws. In this case, the first housing portion 1 is formed with two spaced-apart L-shaped first engaging holes 11, a first engaging plate 15 formed between the first engaging holes 11, a substantially H-shaped second engaging hole 14 spaced apart from first engaging holes 11, and a second engaging plate 16 and a tongue plate 17 extending toward the center of the second engaging hole 14. The first and second engaging holes, the first and second engaging plates 15, 16 and the tongue plate all are located at a position corresponding to the male fastener 4. The first engaging holes 11 are mirror images of each other. The male fastener 4 further includes a pair of first protruding studs 47, a pair of second protruding studs 49 and a stepped portion 48 which are all located on the base portion 41 opposite to the engaging projection 42. The stepped portion 48 is distal from the first protruding studs 47. That is, the second protruding studs 49 are disposed between the stepped portion 48 and the first protruding studs 47. The first protruding studs 47 are spaced apart from each other, and are mirror images of each other. The second protruding studs 49 are spaced apart from each other, and are mirror images of each other. The first and second protruding studs 47, 49 have a similar construction. Each of the first and second protruding studs 47, 49 includes a substantially L-shaped plate 472, 492 having a short side connected to the base portion 41 and a long side parallel to the base portion 41, and an end plate 473, 493 connected between the L-shaped plate 472, 492 and the base portion 41. The L-shaped plate 472, the end plate 473 and the base portion 41 of each first protruding stud 47 cooperatively define a first groove 471 having an opening 474 facing in a direction away from the stepped portion 48. The L-shaped plate 492, the endplate 493 and the base portion 41 of each second protruding stud 49 cooperatively define a second groove 491 having an opening 494 also facing in a direction away from the stepped portion 48.

To fix the male fastener 4 to the first housing portion 1, the first and second protruding studs 47, 49 of the male fastener 4 are inserted into the corresponding first and second engaging holes 11, 14, and are then moved such that two corners of the first engaging plate 15 respectively extend into the first grooves 471 of the first protruding studs 47 through the openings 474 thereof and are limited therein, and two corners of the second engaging plate 16 respectively extend into the second grooves 491 of the second protruding studs 49 through the openings 494 thereof and are limited therein. At this time, a free end of the tongue plate 17 abuts against the stepped portion 48. Therefore, the L-shaped plates 472, 492 of the first and second protruding studs 47, 49 cooperate with the base portion 41 to prevent the male fastener 4 from moving in a direction opposite to the assembly direction (I), and the endplates 473, 493 of the first and second protruding studs 47, 49 cooperate with the base portion 41 to prevent the male fastener 4 from moving in a direction perpendicular to the assembly direction (I).

To sum up, by using the female and male fasteners 3, 4 which can be detachably connected to each other along the assembly direction (I), and by providing the grip members 5 on which forces in the direction opposite to the assembly direction (I) may be applied thereto, the first and second housing portions 1, 2 can be disassembled or assembled without using any additional tool or component, thereby reducing the operating time. Further, since the female and male fasteners 3, 4 can be disengaged in the direction opposite to the assembly direction (I), no extra space is required for disengaging the female fasteners 4 from the male fasteners 4, so that the space requirement for disassembling the second housing portion 2 from the first housing portion 1 can be minimized. Thus, the object of the present disclosure can be achieved.

While the present disclosure has been described in connection with what is considered the most practical embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. An electromagnetic interference (EMI) shielding device for receiving an electronic component, comprising:
   a first housing portion;
   a second housing portion removably fixed to said first housing portion along an assembly direction, said first and second housing portions cooperatively defining a receiving space for receiving the electronic component;
   at least two spaced-apart female fasteners fixed to one of said first and second housing portions, each of said female fasteners including an engaging groove having an opening facing the other one of said first and second housing portions;
   a plurality of male fasteners corresponding in number to said female fasteners, said male fasteners being spacedly fixed to the other one of said first and second housing portions, each of said male fasteners extending engagingly into said engaging groove of a corresponding one of said female fasteners through said opening; and
   at least one grip member connected to one of said first and second housing portions, said grip member being applied with a force along said assembly direction or along a direction opposite to said assembly direction to engage or disengage said male and female fasteners.

2. The EMI shielding device of claim 1, wherein said female and male fasteners are made of metal.

3. The EMI shielding device of claim 2, wherein each of said female fasteners includes two resilient arms cooperatively defining said engaging groove and cooperatively clamping therebetween a corresponding one of said male fasteners when the corresponding said male fastener extends into said engaging groove.

4. The EMI shielding device of claim 3, wherein said engaging groove of each of said female fasteners has a teardrop shape, each of said male fasteners including an engaging projection that has a teardrop shape and that is fittingly engaged in said engaging groove of the corresponding said female fastener.

5. The EMI shielding device of claim 4, wherein each of said male fasteners further includes a base portion fixed to said other one of said first and second housing portions, and a neck portion connected between said base portion and said engaging projection, said neck portion having a width smaller than a maximum width of said engaging projection, said resilient arms respectively having limiting end portions that extend toward each other and that cooperatively pinch therebetween a portion of said engaging projection that is proximate to said neck portion.

6. The EMI shielding device of claim 5, wherein said one of said first and second housing portions includes a plurality of fixing holes corresponding in number to said female fasteners, each of said female fasteners further including two fixed arms respectively located on outer sides of said resilient arms, and a connecting portion connecting said fixed arms and said resilient arms, each of said fixed arms having an outer surface formed with a fixed groove, a minimum distance between said fixed grooves of said fixed arms being substantially equal to a length of a corresponding one of said fixing holes, said fixed grooves of said fixed arms being respectively engaged two opposite sides of a wall which defines a corresponding said fixing hole.

7. The EMI shielding device of claim 6, wherein each of said fixed arms includes a main body connected to said connecting portion and having said outer surface, a bent portion extending outwards from one end of said main body that is distal from said connecting portion, and a wedge-shaped portion projecting from said outer surface of said main body and spaced apart from said bent portion, said main body, said bent portion and said wedge-shaped portion cooperatively defining said fixed groove.

8. The EMI shielding device of claim 4, wherein said engaging projection of each of said male fasteners has a through hole extending in a direction perpendicular to said assembly direction.

9. The EMI shielding device of claim 5, wherein said other one of said first and second housing portions is formed with two spaced-apart retaining holes, each of said grip members including a grip portion for gripping by a hand and having two opposite ends inserted respectively into said retaining holes, and two retaining portions respectively connected to said two opposite ends of said grip portion and respectively and movably retained in said retaining holes, each of said retaining portions having a width larger than that of a respective one of said retaining holes.

10. The EMI shielding device of claim 9, wherein said other one of said first and second housing portions is formed with an engaging hole, an insert hole, and a hook hole which are spacedly arranged in a row and which are located at a position corresponding to one of said male fasteners, said engaging hole having a large-diameter hole section and a small-diameter hole section which are in spatial communication with each other, each of said male fasteners further including a protrusion protruding from said base portion in a direction opposite to said engaging projection, a bent arm extending outwardly from said base portion, and an engaging hook located at one end of said bent arm, said protrusion having a neck portion and a head portion formed at one end of said neck portion, said neck portion having a diameter approximately equal to or slightly smaller than that of said small-diameter hole section of said engaging hole, said head portion having a diameter larger than that of said neck portion but smaller than that of said large-diameter hole section of said engaging hole, said bent arm being inserted into said insert hole to engage said protrusion and said engaging hook with said small-diameter hole section of said engaging hole and said hook hole, respectively.

11. The EMI shielding device of claim 9, wherein said other one of said first and second housing portions is formed with two spaced-apart engaging holes at a position corresponding to one of said male fasteners, each of said engaging holes having a large-diameter hole section and a small-diameter hole section which are in spatial communication with each other, each of said male fasteners further including two spaced-apart protrusions protruding from said base portion in a direction opposite to said engaging projection, each of said protrusions having a neck portion and a head portion formed at one end of said neck portion, said neck portion having a diameter approximately equal to or slightly smaller than that of said small-diameter hole section of a corresponding one of said engaging holes, said head portion having a diameter larger than that of said neck portion but smaller than that of said large-diameter hole section of the corresponding said engaging hole, each of said protrusions being inserted into said large-diameter hole section of the corresponding said engaging hole and then moved toward the corresponding said small-diameter hole section of the corresponding said engaging hole to fittingly engage the same.

12. The EMI shielding device of claim 9, wherein said other one of said first and second housing portions is formed with two spaced-apart L-shaped first engaging holes, a first engaging plate formed between said first engaging holes, a substantially H-shaped second engaging hole spaced apart from said first engaging holes, and a second engaging plate and a tongue plate extending toward the center of said second engaging hole, said first and second engaging holes, said first and second engaging plates and said tongue plate all being located at a position corresponding to one of said male fasteners, each of said male fasteners further including a pair of first protruding studs, a stepped portion and a pair of second protruding studs which are located on said base portion opposite to said engaging projection, said first protruding studs being spaced apart from each other and being mirror images of each other, said stepped portion being distal from said first protruding studs, said second protruding studs being spaced apart from each other, being mirror images of each other and being located between said first protruding studs and said stepped portion, said first protruding studs respectively defining a first groove having an opening facing in a direction away from said stepped portion, said second protruding studs respectively defining a second groove having an opening also facing in a direction away from said stepped portion, when each of said male fasteners is connected to said other one of said first and second housing portions, two corners of said first engaging plate are respectively extended into said first grooves of said first protruding studs, two corners of said second engaging plate are respectively extended into said second grooves of said second protruding studs, and a free end of said tongue plate abuts against said stepped portion.

* * * * *